United States Patent [19]

Nicholas et al.

[11] 3,929,512

[45] Dec. 30, 1975

[54] SEMICONDUCTOR DEVICES

[75] Inventors: Keith Harlow Nicholas, Reigate; Ronald Alfred Ford, Crawley; Julian Robert Anthony Beale, Reigate, all of England

[73] Assignee: U.S. Philips Corporation, New York, N.Y.

[22] Filed: Sept. 10, 1973

[21] Appl. No.: 395,912

Related U.S. Application Data

[63] Division of Ser. No. 204,229, Dec. 2, 1971, Pat. No. 3,796,929

[30] Foreign Application Priority Data

Dec. 9, 1970 United Kingdom............... 58478/70

[52] U.S. Cl. .................................................. 148/1.5

[51] Int. Cl.[2] .......................................... H01L 21/00

[58] Field of Search ................................ 148/1.5 CP

[56] References Cited

UNITED STATES PATENTS

| | | | |
|---|---|---|---|
| 3,444,100 | 5/1969 | Mayer | 148/1.5 |
| 3,472,751 | 10/1969 | King | 148/1.5 |
| 3,657,542 | 4/1972 | Futch | 148/1.5 |
| 3,790,411 | 2/1974 | Simms | 148/1.5 |

*Primary Examiner*—Peter D. Rosenberg
*Attorney, Agent, or Firm*—Frank R. Trifari; Jack Oisher

[57] ABSTRACT

A method of improving the voltage linearity of a semiconductor resistor for use, for example, in integrated circuit manufacture, which linearity is deteriorated by the loss of carriers in the resistor at the vicinity of a junction separating the resistor region from the semiconductor body. The method consists of bombarding the semiconductor to implant therein in the vicinity of the junction neutral ions, such as neon, forming lattice damage. The concentration of implanted ions and lattice damage is so high as to reduce the effective mobility of charge carriers in the region resulting in the improved voltage linearity.

12 Claims, 8 Drawing Figures

SEMICONDUCTOR DEVICES

This is a division, of application Ser. No. 204,229, filed Dec. 2, 1971, now U. S. Pat. No. 3,796,929.

This invention relates to semiconductor devices comprising a semiconductor body in which a resistance region of one conductivity type is present adjacent a surface of the body, forms a p-n junction with the adjacent body portion of the opposite conductivity type and is so contacted as to provide the circuit function of a resistor, and further relates to methods of manufacturing such a semiconductor device.

When a voltage is applied across the contacts of a resistor which includes a p-n junction, some charge carriers in the resistance region are lost from conduction as a result of their removal at the depletion layer associated with the p-n junction. The width of the depletion layer depends on the applied voltage. Thus, the number of carriers removed from conduction between the resistor contacts depends on the voltage applied between these contacts, so that a non-linear voltage characteristic results.

It is desirable to manufacture high value resistors which include a p-n junction but which have improved voltage linearity.

The present invention provides an improvement of the voltage linearity of a resistor, by implanting neutral ions of suitable energy in the semiconductor body to introduce neutral ions and crystal lattice damage at least in the vicinity of the p-n junction so as to reduce the effective mobility of majority charge carriers in the vicinity of the p-n junction.

The change in conductivity in an elemental length of the resistor may be represented by the following simple formula:

$\Delta\sigma = \Delta N . e . \mu$.

Where $\Delta\sigma$ is the change in conductivity;

$\Delta N$ is the number of carriers lost to the depletion layer;

$\mu$ is the effective mobility of these charge carriers, and $e$ is the charge on an electron.

In known resistors, the effective mobility of majority charge carriers in the resistance region in the vicinity of the p-n junction is comparatively high, since the impurity concentration of the one conductivity decreases considerably in the vicinity of the p-n junction; this is particularly so when the resistance region is formed by type-determining impurity diffusion from the surface, and is even so when the region is formed by type-determining impurity ion implantation through the surface. When the resistance region is formed by type-determining impurity ion implantation the implantation causes semiconductor crystal lattice damage some of which usually remains after annealing. However, the maximum crystal lattice damage produced by the implantation has been found to lag behind the maximum implanted impurity ion concentration, for example at a depth of approximately 0.7 of the depth of the maximum implanted impurity ion concentration; thus, in the implantation tail in the vicinity of the p-n junction, the crystal lattice damage so produced is light. As a result, known high-value resistors formed by such conductivity-type impurity ion implantation have a high carrier mobility in the vicinity of the said p-n junction; as indicated by the formular stated hereinbefore, such resistors have a significant non-linear voltage characteristic, particularly when their sheet resistivity is above approximately 5 KΩ/sq.

According to a first aspect of the present invention a semiconductor device comprises a semiconductor body in which a resistance region of one conductivity type is present adjacent a surface of the body, forms a p-n junction with the adjacent body portion of the opposite conductivity type and is so contacted as to provide the circuit function of a resistor, and implanted neutral ions and associated semiconductor crystal lattice damage are present in the resistance region in the vicinity of the said p-n junction in such a high concentration as to significantly improve the voltage linearity of the resistor by reducing the effective mobility of charge carriers in the resistance region in the vicinity of the said p-n junction.

Neutral ions are ions of electrically inactive impurities which do not substantially influence the concentration of free charge carriers, that is to say, which accept or donate substantially no free charge carriers; they may be of an inert gas, for example neon, or/and, where appropriate, of a Group IV element of the Periodic Table, such as tin, or/and of the semiconductor element, for example silicon. They may even be of an impurity having slight electrical activity, such as nitrogen, for example. These ions may be located at interstitial or substitutional sites in the crystal lattice.

Associated semiconductor crystal lattice damage, for example dislocations, may be termed "radiation damge".

This reduction in charge carrier mobility in the resistance region in the vicinity of the p-n junction appears to be due to increased scattering of the charge carriers by the implanted neutral ions and associated damage, and in particular the radiation damage component usually appears to be the more dominant. By thus reducing the effective mobility, the change in conductivity $\Delta\sigma$ with voltage is reduced and more linear high value resistors can be made. The linearity can be improved by a factor of at least two, for a given sheet resistivity in the resistance region; for example the improvement factor may be at least 3 or at least an order of magnitude.

It should be noted that in our co-pending British Pat. application No 54878/68, which corresponds to U.S. Pat. No. 3,683,306, there is described a method of reducing the temperature coefficient of a resistor by providing an appropriate concentration of neutral impurity in the semiconductor resistance region. In that case, scattering of charge carriers by the crystal lattice appears to contribute a positive factor to the temperature coefficient, while scattering by impurity (both electrically active and neutral) appears to contribute a negative factor; the neutral impurity is provided in the resistance region in a concentration which is large enough to substantially balance the excess positive factor resulting from lattice scattering but small enough not to cause a large negative temperature coefficient due to impurity scattering. In this manner the temperature coefficient can have a magnitude less than 750 p.p.m./°C. To further increase the neutral impurity concentration would be undesirable, in the context of the invention of application No. 54878/68, as it would increase the magnitude of the temperature coefficient in the negative direction. Surprisingly it has been found that further increasing a certain neutral impurity concentration in a resistance region, particularly in the vicinity of the p-n junction, is not undesirable in the context of the present invention, since although the magnitude of the temperature coefficient increases in the negative direction, the voltage linearity can be significantly improved.

In devices in accordance with the present invention, the effective mobility of majority charge carriers in the resistance region in the vicinity of the said p-n junction may be, for example, at most a third, or at most a tenth, of the value in the absence of the implanted neutral ions and associated damage. The said mobility can be at least one order of magnitude (for example two orders of magnitude) less than the value in the absence of the implanted neutral ions and associated damage.

The combined concentration of the implanted neutral ions and associated damage may have a peak value in the vicinity of the said p-n junction where the impurity atom concentration of the one conductivity type is decreasing. The value of this combined concentration in the depletion layer present at the said p-n junction under a given operating voltage is important for determining the effective mobility in the depletion layer in the resistance region and hence the voltage linearity of the resistor. However, radiation damage and neutral ions may be present throughout the depth of the resistance region as well as in the depletion layer at the said p-n junction.

The sheet resistivity of the resistance region can be considerably increased by the presence of the implanted neutral ions and associated damage, particularly but not only when implanted neutral impurity is present throughout the resistance region. The sheet resistivity of the resistance region may be, for example, at least 30 KΩ/sq.; however, the said sheet resistivity can be higher, for example at least 0.25 M Ω/sq. or even possible 1 M Ω/sq.

The resistance region may be contacted by metal electrodes on more highly conductive contact regions of the body. When the semiconductor device is an integrated circuit, at least one of the contacts to the resistance region of the resistor may be a semiconductor region of another circuit element of the circuit, for example the base region of a bipolar transistor, or the source or drain region of a field-effect transistor.

According to a second aspect of the invention, in a method of manufacturing a semiconductor device comprising the provision in a semiconductor body of a resistance region of one conductivity type of a resistor adjacent a surface of the body and forming a p-n junction with the adjacent body portion of the opposite conductivity type, neutral ions are implanted in the body where the said p-n junction is to be or is formed, the neutral ion implantation and any subsequent heat treatment being so performed as to provide in the device in the vicinity of the said p-n junction such a concentration of implanted neutral ions and associated semiconductor crystal lattice damage as to improve the voltage linearity of the resistor by a predetermined value, by reducing the effective mobility of majority charge carriers in the resistance region in the vicinity of the said p-n junction.

As mentioned hereinbefore, the neutral ions may be of an inert gas, for example neon or nitrogen and/or, where appropriate, a Group IV element such as tin or the semiconductor element.

Neon is a particularly suitable neutral ion for implanation, as it is light enough to penetrate, for example through an insulating layer, into the semiconductor body to the depth of the said p-n junction and yet heavy enough to produce appreciable radiation damage at low doses.

The concentration of radiation damage formed by ion implantation is reduced by annealing during a heating treatment. Thus, a heat treatment effected to the semiconductor body at the same time as, and/or subsequent to, the neutral ion implantation is controlled to retain the desired amount of radiation damage in the manufactured device.

The energy of the neutral ions may be such that the implanted neutral ions have a peak concentration immediately below where the said p-n junction is to be or is formed. The peak radiation damage caused by these implanted neutral ions lags behind the maximum ion concentration and so can have a peak value at the said p-n junction and in the part of the resistance region where the depletion layer is to be formed.

In one form, the resistance region is formed by thermal diffusion of impurity atoms of the one conductivity type.

In another form, the resistance region is formed by implantation of impurity ions of the one conductivity type. In this case, the energy of the neutral ions may be such that the implanted neutral ions have a peak concentration in or/and immediately below the implanation tail of the ions of the one conductivity type. The implantations may be effected in either order, and one or more annealing treatments may be performed. However, it appears that particularly reproduceable high value resistors can be formed when the neutral ion implantation is effected before the implantation of impurity ions of the one conductivity type; in this case, a single annealing treatment may be performed after both implantations.

The radiation damage may be partially annealed by heating during implantation, in which case the implantation is understood to include an annealing treatment. However, an annealing treatment at a low temperature may be employed after implantation; thus, for example, the radiation damage may be partially annealed subsequent to implantation by heating the body at a temperature of at most 500°C, for example.

An embodiment of the first and second aspects of the present invention will now be described, by way of example, with reference both to FIGS. 1 to 6 of the diagrammatic drawings accompanying the Provisional Specification and to FIGS. 7 and 8 of the accompanying diagrammatic drawings, in which.

Figure 1:
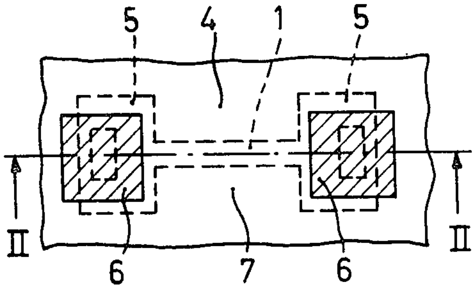
FIG. 1 is a plan view of a body portion of a semiconductor device.
Figure 2:
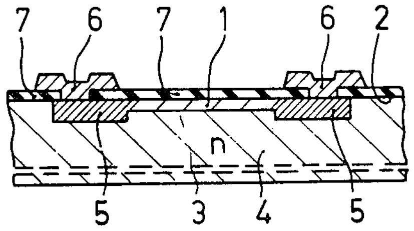
FIG. 2 is a cross-section of the body portion of FIG. 1 taken on the line II—II of FIG. 1.

The body portion shown in FIGS. 1 and 2 is part of a monocrystalline silicon body, in which a p-type boron-implanted resistance region 1 is present adjacent a surface 2 of the body portion. The p-type resistance region 1 forms a p-n junction 3 with the adjacent n-type portion 4 of the body remote from the surface 2. The region 1 is contacted to provide the circuit function of a resistor by high conductance p-type contact regions 5 and metal layer electrodes 6. The electrodes 6 are hatched in the plan view of FIG. 1.

Implanted neutral ions and associated radiation damage are present in the resistance region 1 in the vicinity of the p-n junction 3 remote from the surface 2 in such a concentration that the effective mobility of holes in the resistance region 1 in the vicinity of the p-n junction 3 remote from the surface 2 is reduced approximately tenfold. The voltage linearity of this resistor is improved by approximately an order of magnitude, compared with a resistor of which the resistance region has the same sheet resistivity at low voltage values and was formed using implantation of only boron.

The implanted neutral ions may be of neon, silicon, thin or even nitrogen. However, the following two examples of methods of manufacturing such a resistor will be described hereinafter only in terms of neon ions, for the sake of simplicity. It should be understood that silicon, tin or even nitrogen ions may be employed in these methods, by appropriately changing where necessary the ion energy and dose.

Figure 3:
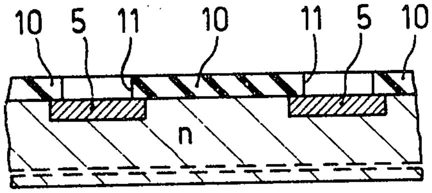
FIGS. 3 and 4 are cross-sectional views of the body portion of FIGS. 1 and 2 at two stages during manufacture, and taken on the same line as FIG. 2.
Figure 4:
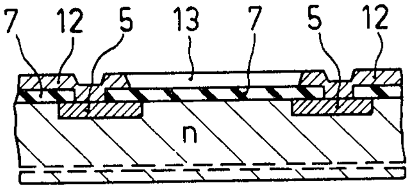
Figure 5:
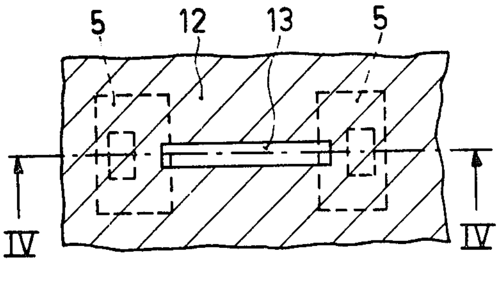
FIG. 5 is a plan view of the body portion at the stage of FIG. 4.

Such a resistor can be manufactured in the following manner:

An n-type silicon wafer having a resistivity of between 3 and 5 ohm-cm. and its major surfaces approximately at right angles to a particular crystal direction is provided with a silicon oxide layer 10 in a conventional manner. By a photolithographic and etching method openings 11 of 30 microns by 40 microns are formed in the oxide layer 10. A large number of resistors together with other circuit elements are formed simultaneously on the same silicon wafer; however FIGS. 3 to 5 only show a wafer portion in which one resistor is formed, and the manufacture will be described in terms of only one resistor.

Boron is diffused into the wafer through the openings 11 to form the contact regions 5. The sheet resistivity of these diffused p-type contact regions so formed is between 40 and 60 Ω/sq.

The oxide layer 10 is now etched away, and a new silicon oxide layer 7 having a thickness of approximately 0.12 microns is thermally grown. Contact openings of 30 microns by 16 microns are provided in the oxide layer 7 by a photolithographic and etching process. Aluminum is then deposited to form a layer 12 on the oxide layer 7 and on the exposed portions of the contact regions 5 at the contact openings in the oxide layer 7. A stripe-shaped opening 13 is etched in the aluminum layer 12 between the diffused contact regions 5 and the contact openings in the oxide layer 7.

In the subsequent implantations the aluminum layer 12 with the opening 13 is used as a masking pattern so that ions are only implanted in the wafer through the opening 13 in the aluminium layer 12. Two ion bombardments are effected, one of neutral ions and one of boron. After both bombardments a single annealing treatment is performed at 500°C. After the implantations, the aluminum layer 12 is removed by etching, with the exception of squares of approximately 50 microns by 50 microns which form the electrode 6. These electrodes 6 contact the diffused contact regions 5 of the resistor at the contact openings in the oxide layer 7.

EXAMPLE 1

In this example of the method, the resistor formed was compared with a conventional resistor having the same boron implantation conditions. The major surfaces of the n-type silicon wafer were approximately at right angles to the <100> crystal direction, and the boron implantation was effected prior to the neutral ion implantation.

40 KeV boron ions were directed at the whole of the wafer and implanted through the oxide layer 7 at the opening 13 to form the p-type resistance region 1 which forms the p-n junction 3 with the adjacent n-type portion. The boron ion dose was approximately $10^{15}$ ions/cm$^2$.

Subsequently, half the wafer was bombarded with 100 KeV neon ions at an ion dose of $2 \times 10^{15}$ ions/cm$^2$. The neon ions are implanted through the resistance region 1 but have a peak concentration in the vicinity of the p-n junction 3. The neon ions were directed at only half the silicon wafer so that only the resistors formed in that half of the wafer have an implanted neon concentration. Other non-neon implanted resistors were thus formed in the other half of the wafer for comparison with the neon implanted resistors. These non-neon implanted resistors are conventional boron-implanted resistors. For the neon and boron implantations, the orientation of the bombarding ion beam was approximately 8° off the <100> crystal direction.

Using this process, and after annealing at 500°C, the sheet resistance of non-neon implanted resistors formed was found to be approximately 2 KΩ/sq. while the neon-implanted resistors formed were formed to have a higher sheet resistance of approximately 20 KΩ/sq.

Figure 6:
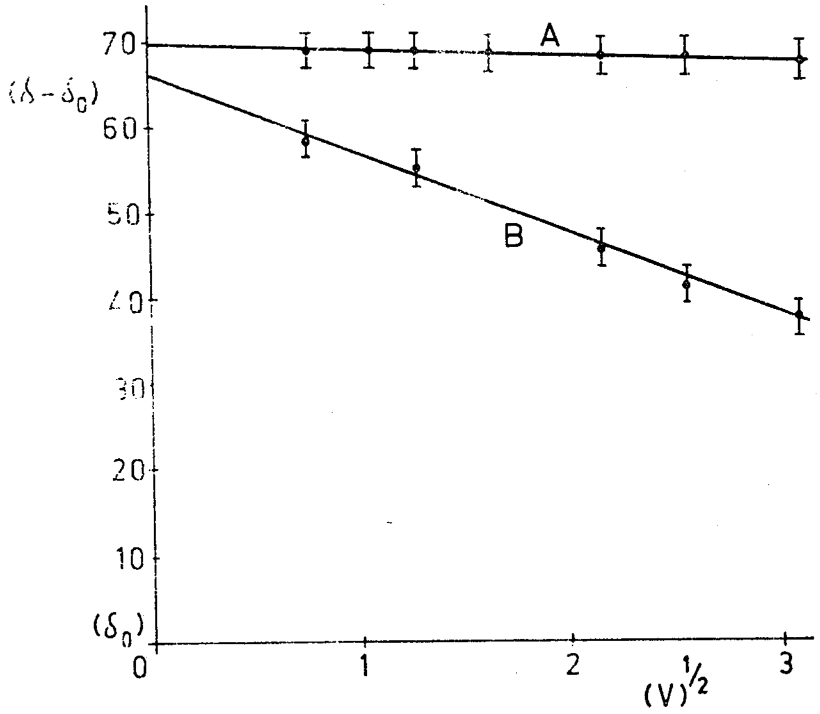
FIG. 6 is a graph showing the change in sheet conductivity as a function of junction bias for different resistors.

Graphs of conductivity change ($\sigma - \sigma o$) against voltage V for the neon implanted and non-neon implanted resistors formed are shown in FIG. 6. The square root of the voltage (V) is plotted as the abscissa. This voltage is a reverse-biased voltage across the p-n junction 3 between a contact on the n-type portion 4 and the two electrodes 6 of the resistor. The ordinate is the change in sheet conductivity $\sigma - \sigma o$ in the resistance region 1. The graph for the neon implanted resistors is designated by reference A, and the origin $\sigma o$ of the ordinate for these resistors is zero. The graph for the non-neon implanted resistors is designated B, and the origin $\sigma o$ of the ordinate for these resistors is 500. The slope of the graphs A and B is a measure of the effective mobility of charge carriers in the resistance region 1 in the vicinity of the p-n junction 3 remote from the surface 2. These slopes give a value of approximately 20 cm$^2$/V.sec. for the neon implanted resistors, and a value of approximately 400 cm$^2$/V.sec. for the non-neon implanted resistors. Thus, the radiation damage and implanted neon in the neon-implanted resistor have reduced the effective mobility of charge carriers in the vicinity of the p-n junction 3 by more than a factor of 10. Thus, the neon implant has very significantly reduced the change in conductivity $\Delta\sigma$ with voltage in an elemental length of the resistor. Although the leakage currents in the neon implanted resistor were approximately five times those in the non-neon resistors, the increased sheet resistivity is at least a partial compensation for this effect.

EXAMPLE 2

In this example of the method, the resistor formed was compared with a conventional boron-implanted resistor having the same sheet resistivity at low voltage values. The major surfaces of the n-type silicon wafer for each type of resistor were approximately at right angles to the <111> crystal direction, and the boron implantation for the neon implanted resistors was effected after the neon implantation.

Neon-implanted resistors were formed in one wafer. The one wafer was bombarded with 100 KeV neon ions at an ion dose of $2 \times 10^{13}$ ions/cm$^2$. The neon ions were implanted throughout the portion where the resistance region 1 is to be formed but have a peak concentration in the vicinity where the p-n junction 3 is to be formed. Subsequently, 40 KeV boron ions were directed at the one wafer and implanted through the oxide layer 7 at the opening 13 to form the p-type resistance region 1 which forms the p-n junction 3 with the adjacent n-type portion. The boron ion dose was approximately $2 \times 10^{13}$ ions/cm$^2$.

Non-neon implanted resistors were formed in another similar wafer. This other wafer was bombarded with 40 KeV boron ions which were implanted through the oxide layer 7 at the opening 13, to form the p-type resistance region 1 which forms the p-n junction 3 with the adjacent n-type portion. In this case, the boron ion dose was only $5 \times 10^{12}$ ions/cm$^2$, so that the resistance regions formed for both the neon implanted and non-neon implanted resistors should have the same sheet resistivity at low voltages.

Figure 8:
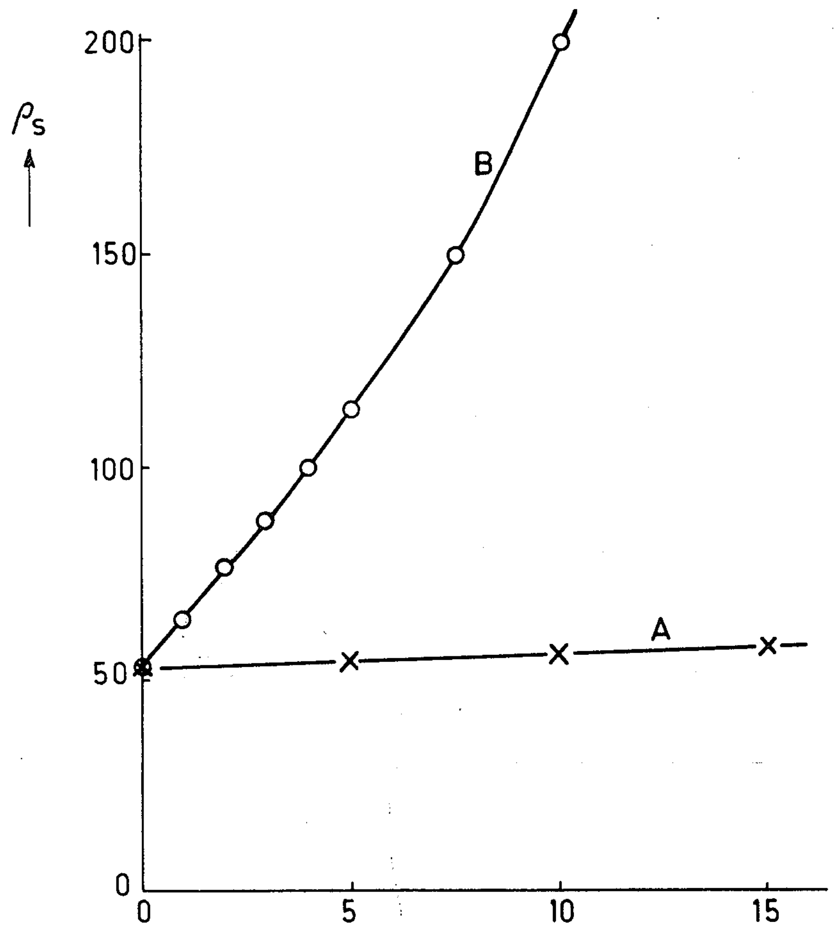
FIG. 8 is a graph showing the change in incremental sheet resistance as a function of applied voltage and is derived from FIG. 7.

Using this process, and after annealing at 500°C, the sheet resistance of both the neon implanted and non-neon implanted resistors was found to be approximately 50 KΩ/sq. at low voltages, see FIG. 8.

Figure 7:
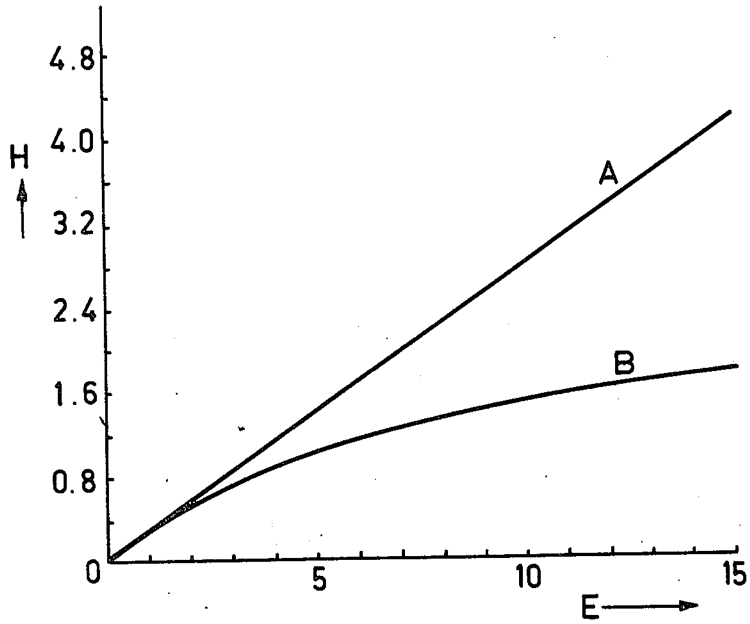
FIG. 7 is a graph showing the change in current through different resistors as a function of voltage applied between the resistor contacts.

Graphs of change of current through these resistors as a function of voltage E applied between their electrodes 6 are shown in FIG. 7. The current I is in μAmps and the voltage E in volts. The electrode 6 at the lower potential is connected to the n-type substrate of the resistor. As can be seen from FIG. 7, the neon implanted resistors, designated by reference A, are considerably more linear than the non-neon implanted resistors, designated by reference B.

Graphs of the change in incremental sheet resistance $\rho_s$ in KΩ/sq. with applied voltage E between electrodes 6 are shown in FIG. 8 for the neon implanted resistors (A) and the non-neon implanted resistors (B). $\rho_s$ is derived from the gradient of the slopes of graph A and B of FIG. 7 correcting for the aspect ratio of the resistors. At low values of voltage E the sheet resistance for both resistors A and B is approximately 50 KΩ/sq. However, as can be seen from FIG. 8, the incremental sheet resistance of the non-neon implanted resistors (B) increases, with voltage, considerably more rapidly than that of the neon implanted resistors (A). The linearity of the resulting neon implanted resistor A was improved by a factor of at least three compared with the non-neon implanted resistor B of the same initial sheet resistivity.

Leakage currents in the neon implanted resistors (A) were found to be increased by a factor of approximately 7 to approximately 70 n.Amps/mm$^2$., which is still well below the current flow in operation in a resistor of practical dimensions, and is acceptable for integrated circuit applications. The temperature coefficient of the resistors was measured and found to be approximately $-4 \times 10^3$ p.p.m./°C; this high negative value appears to be due to the high concentration of implanted neon ions and associated damage in the resistance region.

What we claim is:

1. A method of manufacturing a semiconductor device having a region of one type conductivity in a semiconductor body portion of the opposite type conductivity and forming a junction with the semiconductor body portion, said one type region having a high sheet resistance and constituting the resistance region of a resistor of the semiconductor device, said device being processed by steps including effecting spaced contacts to the resistance region whereby when a voltage is applied to the contacts the resistor exhibits a voltage linearity determined by its measured resistance as a function of applied voltage, said processing also comprising the step of bombarding said semiconductor body portion with neutral ions to implant in the body at least where the junction is to be or is formed a high concentration of neutral ions and associated semiconductor crystal lattice damage, the concentration of implanted neutral ions and associated semiconductor crystal lattice damage in the resistance region of the finished device after the processing, at least in the vicinity of the said junction, being so high that the effective mobility of majority charge carriers in the resistance region in the vicinity of the said junction is at most one-third of the value in the absence of the implanted neutral ions and associated damage whereby the resistor exhibits improved voltage linearity.

2. A method as claimed in claim 1, wherein the said effective mobility is at least one order of magnitude less than the value in the absence of the implanted neutral ions and associated damage.

3. A method as claimed in claim 2, wherein the implanted neutral ion dose is at least $2 \times 10^{13}$ ions/cm$^2$.

4. A method as claimed in claim 3, wherein the ions are neon.

5. A method as claimed in claim 3, wherein the conductivity type of the resistance region is determined by implanting impurity ions characteristic of the one type conductivity.

6. A method as claimed in claim 1, wherein the resistor has a sheet resistance of at least 20 K. ohms/square.

7. A method as claimed in claim 6, wherein said sheet resistance is at least 50 K.ohms/square.

8. A method as claimed in claim 1, wherein subsequent to the neutral ion implantation, the body is heated at a temperature of at most 500°C.

9. A method as claimed in claim 1, wherein the neutral ions are implanted throughout the part of the body where the resistance region is to be or is formed.

10. A method as claimed in claim 1, wherein the energy of the bombarding neutral ions is such that the neutral ions are implanted to form a peak concentration immediately below where the said junction is to be or is formed.

11. A method of manufacturing a semiconductor device having a region of one type conductivity in a semiconductor body portion of the opposite type conductivity and forming a junction with the semiconductor body portion, said one type region having a high sheet resistance and constituting the resistance region of a resistor of the semiconductor device, said device being processed by steps including effecting spaced contacts to the resistance region whereby when a voltage is applied to the contacts the resistor exhibits a voltage linearity determined by its measured resistance as a function of applied voltage, said processing also comprising the step of bombarding said semiconductor body portion with neutral ions to implant in the body at least where the junction is to be or is formed a high concentration of neutral ions and associated semiconductor crystal lattice damage, the concentration of implanted neutral ions and associated semiconductor crystal lattice damage in the resistance region of the finished device, at least in the vicinity of the said junction, being so high that the temperature coefficient of the resistor has a highly negative value of the order of $10^3$ppm/°C whereby the resistor exhibits improved voltage linearity.

12. A method as claimed in claim 5 wherein the neutral ion implantation is effected before the implantation or impurity ions characteristic of the one-type conductivity.

* * * * *